United States Patent [19]

Heung

[11] Patent Number: 5,079,438
[45] Date of Patent: Jan. 7, 1992

[54] CIRCUIT MODULE FAN ASSEMBLY

[76] Inventor: Lap-Yan Heung, 12565 Crenshaw Blvd., Hawthorne, Calif. 90250

[21] Appl. No.: 303,642

[22] Filed: Jan. 30, 1989

[51] Int. Cl.$^5$ .............................................. H05K 7/20
[52] U.S. Cl. .................................... 307/141; 361/383; 361/384; 361/23; 318/254
[58] Field of Search .............................. 361/379–415, 361/23–33; 307/141, 149, 150, 112; 318/430–434, 138, 254, 439; 310/68 R

[56] References Cited

U.S. PATENT DOCUMENTS

| | | | |
|---|---|---|---|
| 3,332,007 | 7/1967 | Livengood et al. | 361/28 X |
| 4,122,508 | 10/1978 | Rumbaugh | 361/384 |
| 4,277,816 | 7/1981 | Dunn et al. | 361/384 |
| 4,296,455 | 10/1981 | Laeycraft et al. | 361/383 |
| 4,354,214 | 10/1982 | Walton | 361/23 |
| 4,356,531 | 10/1982 | Marino et al. | 361/384 |
| 4,401,351 | 8/1983 | Record | 361/393 X |
| 4,513,812 | 4/1985 | Papst et al. | 361/384 X |
| 4,668,898 | 5/1987 | Harms et al. | 318/254 |
| 4,733,115 | 3/1988 | Barone et al. | 361/400 X |
| 4,739,445 | 4/1988 | Tragen | 361/384 |
| 4,751,872 | 6/1988 | Lawson, Jr. | 361/384 X |
| 4,756,473 | 7/1988 | Takemae et al. | 361/384 X |
| 4,758,924 | 7/1988 | Dillon et al. | 361/383 |
| 4,767,262 | 8/1988 | Simon | 361/384 X |
| 4,774,631 | 9/1988 | Okuyama et al. | 361/384 |
| 4,797,783 | 1/1989 | Kohmoto et al. | 361/384 |

Primary Examiner—Paul Ip
Attorney, Agent, or Firm—Charles Berman

[57] ABSTRACT

An electronic circuit module fan assembly is disclosed including a circuit module housing, circuit modules, and a fan module. The fan module has a fan unit for cooling the circuit modules. The fan module can be mounted in the housing interchangeably with the circuit modules. The fan module has time delay circuitry for delaying the time when the fan module is powered up until after the intiial power surge of the electronic system. The fan module also has noise filter circuitry. A fan module is disclosed wherein the fan unit is slidably attached to the fan module to allow the fan to be placed in different positions for cooling purposes. The fan module can be constructed so that the fan unit is interchangeable with a panel having circuitry.

37 Claims, 2 Drawing Sheets

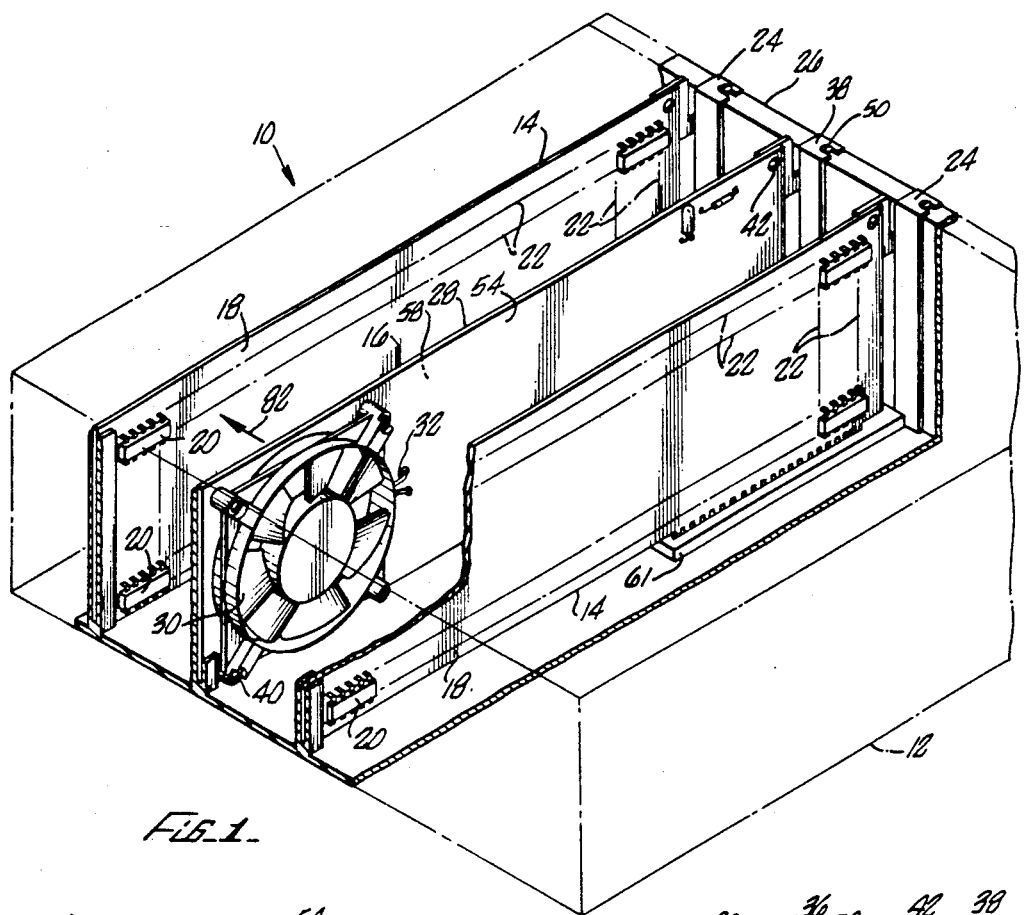
Fig_1_
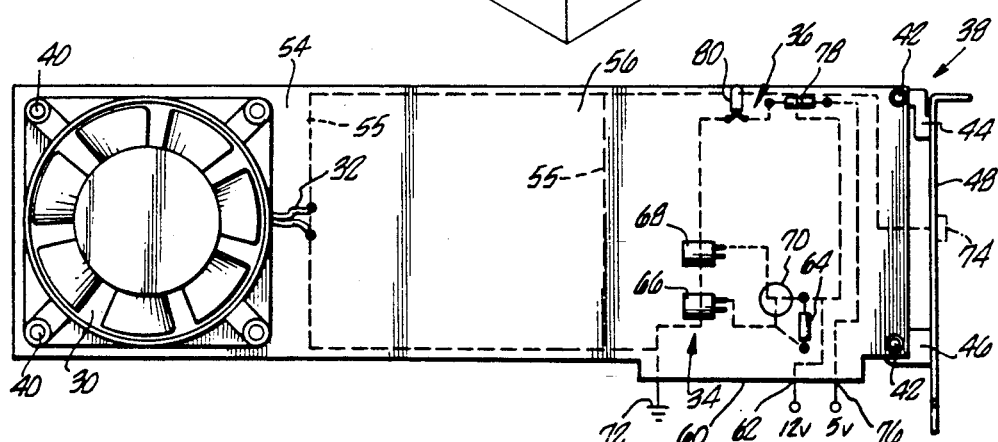
Fig_2_

CIRCUIT MODULE FAN ASSEMBLY

BACKGROUND

The field of the present invention is air cooling systems within electronic systems. More particularly, the present invention relates to a fan assembly for use in an electronic system with circuit modules.

Electronic systems, such as computers, employing modular construction are common. A typical electronic system includes a plurality of circuit modules mounted within a housing. The circuit modules can be easily inserted or removed for replacement or repair. The modular construction contributes to the compactness of the electronic system.

A plurality of modular integrated circuits or chips are typically mounted on each circuit module of current electronic systems. As large scale integration technology has improved, the circuitry per unit area within a modular integrated circuit has increased dramatically. The number of modular integrated circuits which can be packed on a circuit module has also increased. Unfortunately, this increase in the compactness of electronic circuitry has also resulted in an increase in the heat generated per unit area of the circuitry. Therefore, overheating of the numerous chips on circuit modules has presented a serious problem.

To overcome this problem, most electronic systems employ the use of air cooling systems in conjunction with heat sink devices. Typically, air flow from a fan is directed past heat sink devices which are thermally connected to the circuitry on the circuit boards. An example of such a device is illustrated in U.S. Pat. No. 4,122,508 to Rumbaugh. In the modular circuit board assembly disclosed in U.S. Pat. No. 4,122,508, a blower 30 is located in a side panel of the housing 11. The air flow from the blower 30 is directed past heat sinks 19 which are thermally connected to circuit boards 16.

The fan in current electronic systems is usually remote from most of the circuit modules within the electronic system housing. The modular integrated circuits on the circuit modules most remote from the fan receive the least amount of cooling effect because the cooling air absorbs heat as it passes the circuit modules in closer proximity to the fan. In many electronic systems, this problem is exacerbated because the circuit modules which generate the most heat are often required by the physical constraints of the electronic system to be located most remote from the fan. As a result, heat sinks are used to dissipate heat from the integrated circuits more rapidly than would otherwise be possible. However, heat sinks decrease the compactness of the electronic system and increase the cost and complexity of manufacturing the electronic system.

An additional problem arises from the remoteness of the fan from many of the circuit modules within the electronic system. Due to the nature of some system housings, the circuit modules themselves often block the cooling air flow of the fan from reaching the other circuit modules.

A further problem is that modular electronic systems typically have special compartments within the electronic system for housing the fan, thus contributing to expense in the manufacture of the electronic system. A further problem resulting from such compartments is usage of the limited available space within most electronic systems. The special construction of fan compartments further increases the difficulty of removing the fan for maintenance or replacement.

SUMMARY

The present invention solves the foregoing problems. The present invention is an electronic circuit module fan assembly for an electronic system which provides more direct air turbulence on the circuit modules thereby dissipating heat more rapidly and reducing the need for heat sinks. The present invention also provides a more compact, a less complex, and a lower cost cooling system.

The electronic circuit module fan assembly of the present invention comprises at least one circuit module and a fan module within an electronic system. The assembly can also include a circuit module housing. The circuit module housing has receiving means for receivably mounting circuit boards. The circuit module has circuitry and is mounted on the receiving means of the housing.

The fan module has a mounting structure which can be a base board, a mounting means for mounting the fan module in the electronic system, at least one electric fan unit, and a driving circuit which is electrically connected to the fan unit. The mounting means is for mounting the fan module in the electronic system interchangeably with the circuit modules. The electric fan unit is mounted to the mounting structure so that there is space between the fan unit and the circuit modules to be cooled when the fan module is installed in the electronic system. The driving circuit is for selectively activating the fan unit. The fan unit creates air turbulence near the circuit module to cool the circuitry of the circuit module when the driving circuit is activated.

The driving circuit can receive power from the same power source as the circuit board and can have a time delay means for delaying the time when the fan unit is activated after the electronic system is powered on. The driving circuit can further include a noise filter for filtering power transients. The fan module can have a mechanical switch for manually selectively activating the fan unit.

The present invention can also include a light-indicator device for indicating that the electronic system power is on. The fan module of the present invention can further be constructed so that the fan unit is removable and replaceable with modular integrated circuitry.

The present invention also includes a fan module for an electronic system. The fan module has essentially the same features as the fan module of the electronic circuit module fan assembly set forth above.

DRAWINGS

These and other features, aspects, and advantages of the present invention will become better understood with reference to the following description, appended claims, and accompanying drawings where:

FIG. 1 is a perspective view of an electronic circuit module fan assembly of the present invention;

FIG. 2 is a front elevation view of a fan module according to the present invention;

DESCRIPTION

Figure 3:
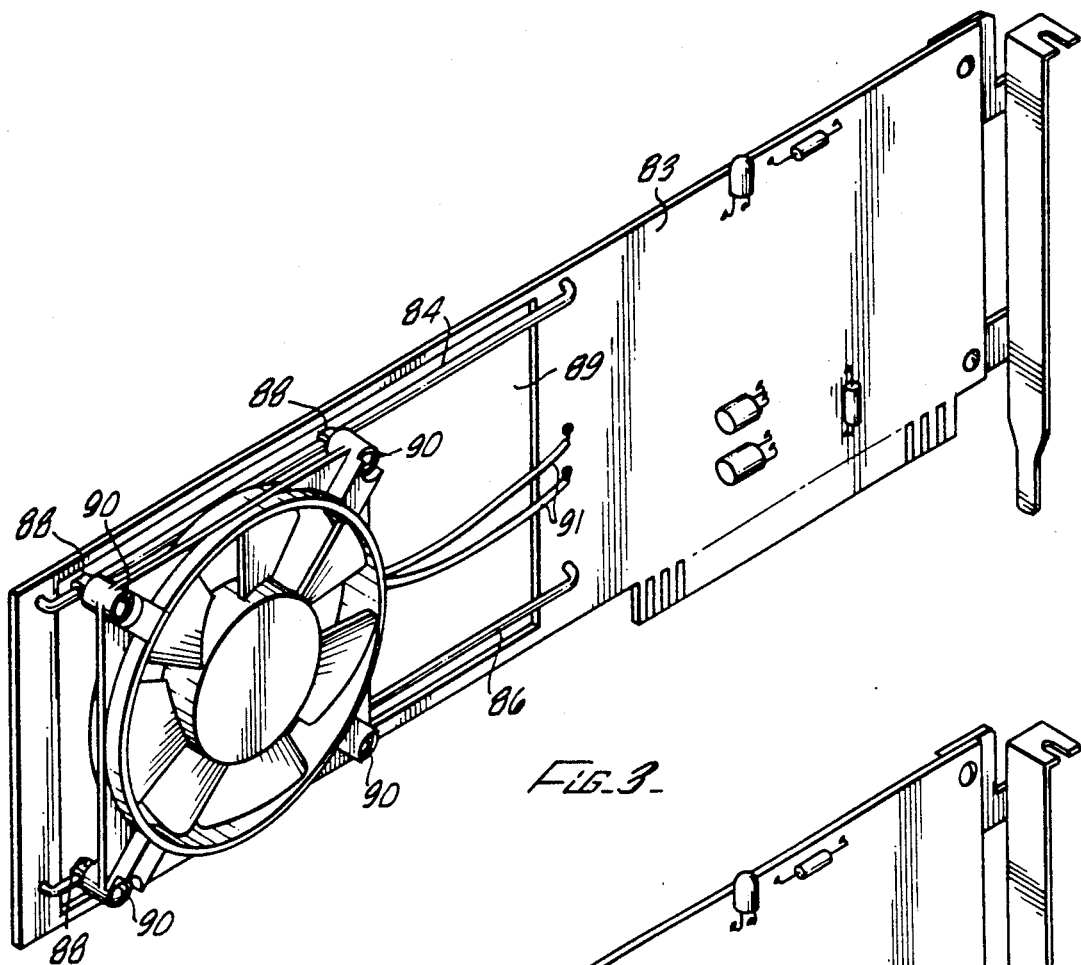
FIG. 3 is a front elevation view of a fan module according to a second embodiment of the present invention.

Referring to FIGS. 1 and 2, an electronic circuit module fan assembly 10 comprises a circuit module housing 12, circuit modules 14, and a fan module 16. The electronic circuit fan assembly 10 is part of a larger electronic system, such as a computer system.

Each circuit module 14 comprises a circuit module base board 18, an array (indicated by the vertical and horizontal double lines 22) of modular integrated circuits 20, and circuit module mounting means 24 for mounting the circuit module 14 on the side wall 26 of the housing 12. The modular integrated circuits 20 are mounted in rows on the base board 18. The side wall 26 functions as a receiving means for receivably mounting circuit modules 14 and fan modules 16 on the housing 12.

The fan module 16 comprises a fan module mounting structure including a base board 28. The fan module 16 further comprises a fan unit 30, fan power wires 32, a driving circuit 34, a light-indicator circuit 36, and fan module mounting means 38 for mounting the fan module 16 on the side wall 26. The fan module mounting means 38 is mounted to the base board 28 by mounting bolts 42. The circuit module mounting means 24 and the fan module mounting means 38 are of identical construction so the circuit modules and fan modules are interchangeable. However, the fan module 16 and the circuit modules 14 can have mounting means of different construction, as long as the fan module fits into the same space and mounts to the same receiving means as the circuit modules 14.

The fan unit 30 is mounted to the fan module base board 28 by fan bolts 40. Therefore, the fan unit 30 is easily removed from the base board 28. In some embodiments of the invention, the mounting structure for the fan unit 30 is not a base board 28. For example, the mounting structure can be a frame with fan module mounting means 38 for mounting the frame to the housing 12. Also, a fan housing can be provided around the fan unit 30 to prevent interference with electronic signals to or from the electronic system.

The base board 28 of the fan module 16 can have modular integrated circuits mounted on the portion of the base board 28 which does not have the fan unit 30. In addition to modular integrated circuits, other electronic components, such as components for telephone communication equipment can be included.

The fan module 28 is electrically connected to the power source of the electronic system by the board connector 60. The board connector 60 inserts into the receiving connectors 61 attached to the housing 12. In some electronic systems, the board connector 60 serves as the fan module mounting means for mounting the base board 28 to the housing 12 because brackets 44, 46, and 48 are not included. The receiving connectors 61 function as electrical connections between the board connectors 60 of the modules 14 and 28 and the electronic system. The receiving connectors 61 can also serve as the mechanical receiving means for receivably mounting the circuit modules 14 and the fan module 28 on the housing 12.

The mounting means 38 comprises upper and lower board brackets 44 and 46, respectively, and L-bracket 48. The upper and lower board brackets 44 are attached to the L-bracket 48 by conventional means, such as rivets or welding. Alternatively, the upper and lower board brackets 44 and 46 can be adapted to fit into slots within the L-bracket 48 for easy installation and removal. The L-bracket 48 is connected to the receiving means by a housing bolt 50. The fan power wires 32 are connected to the board traces 55 by conventional electrical connectors.

The fan module 16, and in particular the driving circuit 34, receives its power from the power source of the electronic system. The driving circuit 34 has a time delay means for ensuring that the fan units will not be powered on at the same time as the other component parts of the electronic system, such as the circuit modules 14. When the electronic system is powered on, many component parts of the electronic system draw current from the system power supply. The time delay means causes the fans to power up after the initial power surge in the electronic system is over. For many electronic systems a time delay of approximately one to two seconds is sufficient.

Figure 4:
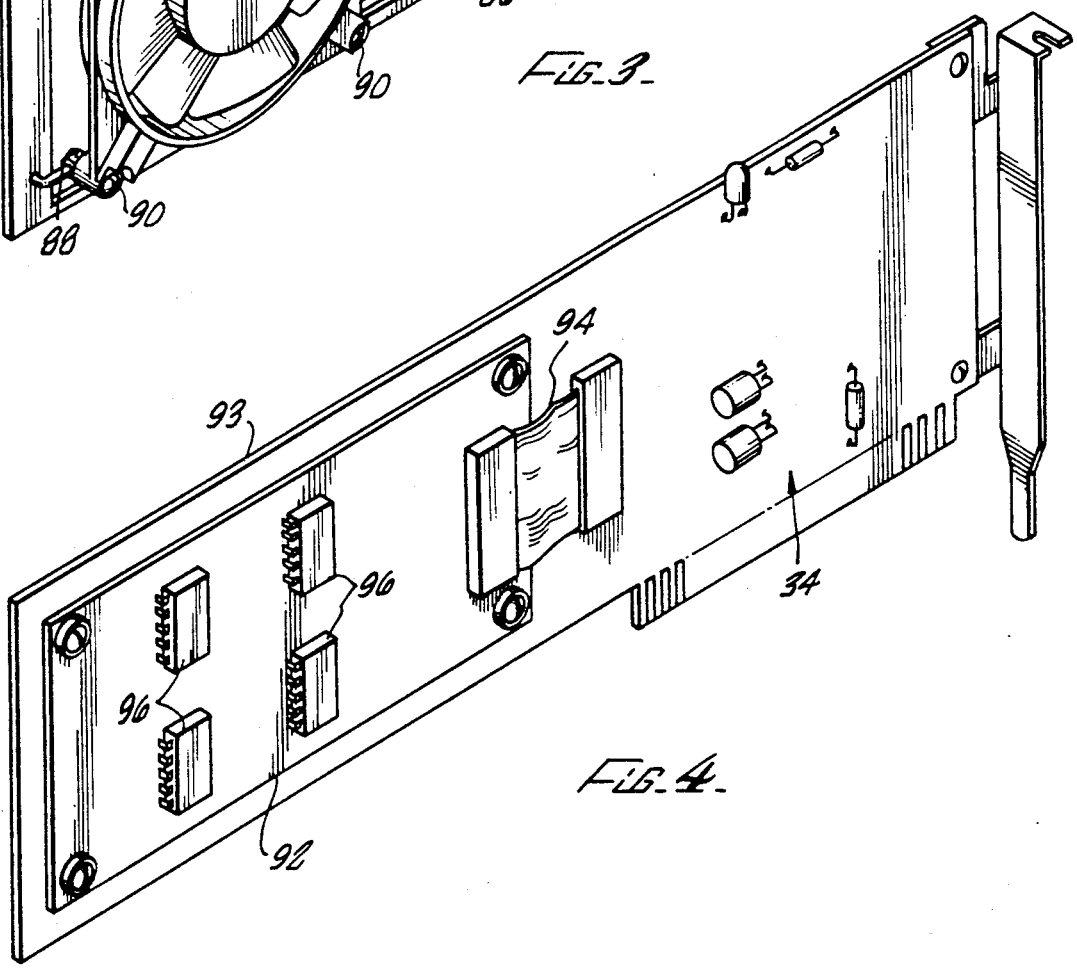
FIG. 4 is a front elevation view of a fan module wherein the fan unit is removed and replaced with a panel having circuitry.

FIGS. 1 and 2 show only one fan unit 30 mounted on a first planar surface 54 of the fan module base board 28. However, a second fan unit could be mounted in the sector 56 on the first planar surface 54. Also, additional fan units could be mounted on the second planar surface 58 of the base board 28 opposite the first planar surface 54. The fan units can be mounted at selected positions along the planar surface of the base board 28. Finally, as is illustrated in FIG. 4, it is possible to construct the fan module 16 so that the fan unit 30 can be removed and replaced with a panel 92 having modular integrated circuitry, as on the circuit modules 14.

The fan unit 30 has a height and width to fit on the base board 28 without protruding beyond the edges of the base board 28. The depth or thickness of the fan unit 30 is such that space is left between the fan module 16 and the circuit modules 14 so cooling air can flow easily. The fan unit 30 is usually on the planar surface of the base board 28 opposite to the circuit module to be cooled.

The time delay portion of the driving circuit 34 is illustrated in FIG. 2. The dotted lines represent electrical traces 55 in the base board 28. The time delay portion of the driving circuit 34 includes an input 62 from a 12 V power source of the electronic system, a 1K ohm resistor 64, a base capacitor 66, an emitter capacitor 68, and a transistor 70. The 12 V input 62, the 1K ohm resistor 64, and the base capacitor 66 are electrically connected in series to ground 72. The input terminal of the resistor 64 is connected to the collector of the transistor 70 and the output terminal of the resistor 64 is connected to the base of the transistor 70. The emitter of the transistor 70 is connected to the emitter capacitor 68. Both the emitter capacitor 68 and the base capacitor 66 can be 220 $\mu f$. The emitter capacitor 68 is connected to ground and thus can function as a noise filter to filter transients from the power source of the electronic system.

A mechanical switch 74 is provided so the fan unit 30 can be manually switched to the on and off states. If a fan unit is provided in sector 56, a similar mechanical switch can be provided.

The light-indicator circuit 36 comprises a 5 V input 76 from the electronic system, a 220 ohm resistor 78, and an indicator light 80, all in series. The indicator light 80 is connected to ground 72. Other light-indicator circuits well known to those skilled in the art can be provided.

The air flow created by the fan unit 30 during operation is initially directly through an opening behind the fan unit 30 and against the adjacent circuit module 14 along the arrow 82. The air then tends to be directed along the surface of the circuit module 14 away from the area of the fan unit 30. A switch can be provided on the fan unit 30 so the direction of the air flow can be changed by changing the rotational direction of the fan blades. In some embodiments of the invention, channels can be provided between the circuit modules 14 and the housing 12 so that air can more easily flow throughout the housing 12. Finally, air vents can be provided in the housing 12 to take in cool air and let out heated air.

Turning to FIG. 3, another embodiment of fan module 83 is illustrated wherein the fan unit 30 is slidable on a set of racks 84 and 86. The fan unit is attached to the racks 84 and 86 by slidable connectors 88. The slidable connectors 88 are attached to the fan unit 30 by connector bolts 90. The slidable connectors 88 slide along the racks 84 and 86 so that the fan unit 30 can be positioned at various locations along the opening 89 to cool circuitry at selected locations on an adjacent circuit module. The driving circuitry is the same as that of FIG. 2 and can be electrically connected to the fan unit by fan wires 91 or by other suitable means well known to those skilled in the art.

FIG. 4 illustrates a fan module 93 on which the fan unit is removed and replaced with a modular integrated circuit panel 92. The circuit panel 92 is electrically connected to the electronic system through the fabric connector 94. In this way, the individual modular integrated circuits 96 can function in the same way within the electronic system as they do on a circuit module. The fan module 93 on which a panel 92 can be mounted is advantageous in that the module can selectively function as a cooling unit or mounting structure for circuitry. The driving circuit 34 on the fan module 93 can be the same as that on the fan module 16 of FIG. 2. The driving circuit 34 is electrically connected when the circuit panel 92 is replaced by a fan unit 30.

The electronic circuit module fan assembly of the present invention has many advantages. The fan module of the present invention can be located directly adjacent to the circuit module to be cooled. The present invention provides more direct air turbulence for cooling of the circuitry than prior cooling systems. The cool air from the fan unit of the present invention displaces the warming air in closest proximity to the circuit module. Thereby preventing the circuit module from getting hot. In prior cooling systems, the fans are typically located remotely from at least some of the circuit modules in the electronic system. The proximity of the fan to the circuit modules can also serve to prevent dust or other particles from accumulating on the circuit modules or their circuitry.

The electronic circuit module fan assembly of the present invention also provides a more compact cooling system because a separate compartment for the fan apparatus is not required. Prior cooling systems typically locate the fan within a separate cabinet in the housing, resulting in more complicated and expensive manufacture of the electronic system and the usage of limited space in the electronic system. An additional advantage of the present invention is that the number of fans used in the cooling system can be varied without major alterations in the electronic system. The fan modules can be removed or added according to the needs of the user of the electronic system. If fan modules are removed, there is more room for additional circuit modules to be installed.

The present invention further provides for ease of removal of the fan modules for maintenance and replacement. One of the advantages of electronic systems having circuit modules is ease of maintenance and replacement of the circuit modules. The present invention takes advantage of this modular construction in relation to the cooling system. A further advantage of the present invention is that it can be easily adapted to draw current from the power source of the electronic system. Moreover, the close proximity of the fan units of the present invention to the circuit modules allows for the employment of fans which draw less power. In prior cooling systems, the remoteness of the fans from the circuit modules often requires fans with high capacity air flows. The proximity of the fans to the circuit modules being cooled also allows for fans with a more compact size and lower cost and complexity.

Finally, the present invention substantially reduces the need for bulky and elaborate heat sinks in thermal connection with the circuitry on the circuit modules. The reason for this is that the air turbulence provided by the fans of the present invention more directly cools the circuit modules.

Although various embodiments of the present invention have been described in considerable detail, other versions and embodiments of the invention are possible. Therefore, the present invention is not limited to the embodiments described herein, but instead is defined by the spirit and scope of the appended claims.

What is claimed is:

1. In combination an electronic circuit module fan assembly for an electronic system comprising:
    (a) a receiving means for receivably mounting a circuit module in the electronic system;
    (b) the circuit module including (i) a printed circuit board, (ii) circuitry and (iii) circuit module mounting means for mounting the circuit module on the receiving means in the electronic system;
    (c) a fan module mounted in the electronic system and having,
        (i) fan module mounting means for mounting the fan module on the receiving means in the electronic system interchangeably with the circuit module;
        (ii) at least one electric fan unit, the fan unit being mounted on the fan module so that there is space between the fan unit and the circuit module;
        (iii) a driving circuit electrically connected to the at least one fan unit for selectively activating the fan unit; and
        (iv) means for reducing an initial power surge of the electronic system;
    the fan unit creating air turbulence near the circuit module to cool the circuitry when the driving circuit is activated.

2. In combination an electronic circuit module fan assembly for an electronic system, the fan assembly comprising:
    (a) a circuit module housing having a receiving means for receivably mounting printed circuit board modules;
    (b) a printed circuit board module having circuitry and a circuit module mounting means for mounting the circuit module on the receiving means of the circuit module housing; and
    (c) a fan module mounted on the receiving means of the housing and having,
        (i) a planar mounting structure;

(ii) fan module mounting means for mounting the fan module on the receiving means interchangeably with the circuit board module;

(iii) at least one electric fan unit mounted on the planar mounting structure, the fan unit being mounted on the mounting structure so that there is space between the fan unit and the circuit board module;

(iv) a driving circuit electrically connected to the at least one fan unit for selectively activating the fan unit; and (v) means for reducing an initial power surge of the electronic system;

the fan unit creating air turbulence in the housing to cool the circuitry of the circuit board module when the driving circuit is activated.

3. Apparatus as in claim 1 or claim 2 wherein the driving circuit receives power from the same electronic power source as the circuit module.

4. Apparatus as in claim 3 wherein the driving circuit has a time delay means for delaying the time between powering up the electronic system and activating the at least one fan module so that the fan unit does not contribute to an initial power surge of the electronic system upon powering the electronic system.

5. Apparatus as in claim 1 or claim 2 further including a mechanical switch electrically connected to the driving circuit for manually selectively activating the fan unit independently of the electronic system.

6. Apparatus as in claim 3 further including a light-indicator device for indicating that the electronic system power is on.

7. Apparatus as in claim 3 wherein the driving circuit includes a noise filter for filtering power transients on the driving circuit.

8. Apparatus as in claim 2 wherein the mounting structure is a rectangular base board and the at least one fan unit does not protrude beyond rectangular edges of the base board.

9. Apparatus as in claim 2 wherein the fan module further includes circuitry mounted on the mounting structure.

10. Apparatus as in claim 2 wherein the at least one fan unit is removable and replaceable with modular integrated circuitry.

11. In combination a fan module for an electronic system having printed circuit board modules and receiving means for receivably mounting the circuit board modules, the fan module comprising:

(a) a planar mounting structure;

(b) fan module mounting means for mounting the fan module on the receiving means in the electronic system interchangeably with at least one of the circuit board modules and receiving means for receivably mounting the circuit modules, the circuit modules including printed circuit boards;

(c) at least one electric fan unit mounted on the planar mounting structure and having a depth such that there is space between the fan module and the circuit modules;

(d) a driving circuit electrically connected to the at least one fan unit for selectively activating the fan unit; and (e) means for reducer an initial power surge of the electronic system;

the fan unit creating air turbulence near the circuit board modules to cool the circuitry of the circuit modules when the driving circuit is activated.

12. In combination a fan module for an electronic system having at least one circuit module and a housing with a receiving means for receivably mounting circuit modules, the fan module comprising:

(a) a planar mounting structure;

(b) a fan module mounting means for mounting the fan module on the receiving means interchangeably with the circuit module, the circuit module including a printed circuit board;

(c) at least one electric fan unit mounted to the mounting structure, the fan unit having a depth such that there is space between the fan module and the circuit module mounted on the receiving means of the housing adjacent to the fan module;

(d) a driving circuit electrically connected to the at least one fan unit for selectively activating the fan unit; and optionally (d) means for reducing an initial power surge of the electronic system;

the fan unit creating air turbulence in the housing to cool circuitry of the circuit module when the driving circuit is activated.

13. Apparatus as in claim 11 or claim 12 wherein the driving circuit receives power from the same electronic power source as the circuit module.

14. Apparatus as in claim 11 or claim 12 further including a mechanical switch electrically connected to the driving circuit for manually selectively activating the fan unit independently of the electronic system.

15. Apparatus as in claim 13 further including a light-indicator device for indicating that the electronic system power is on.

16. Apparatus as in claim 13 wherein the driving circuit includes a noise filter for filtering power transients on the driving circuit.

17. Apparatus as in claim 12 wherein the mounting structure includes a base board.

18. Apparatus as in claim 17 wherein the fan module further includes modular integrated circuitry mounted to the base board.

19. Apparatus as in claim 12 wherein the fan unit is selectively mountable on first and second planar surfaces of the mounting structure.

20. Apparatus as in claim 17 wherein the fan module mounting means includes a board connector and the receiving means includes a receiving connector.

21. In combination a fan module for an electronic system having a housing with a receiving means for receivably mounting circuit modules, the fan module comprising:

(a) a base board including first and second planar surfaces;

(b) fan module mounting means for mounting the fan module on the receiving means interchangeably with the circuit modules;

(c) at least one electric fan unit mounted to at least one of the planar surfaces of the base board, the fan unit having a depth such that there is space between the fan module and a circuit module mounted on the receiving means of the housing adjacent to the fan module; and (d) a driving circuit electrically connected to the at least one fan unit and the electronic system for activating the fan unit when the electronic system is powered on, the driving circuit having means for reducing an initial power surge of the electronic system.

22. Apparatus as in claim 1 or claim 2 wherein the fan module includes a plurality of fan units.

23. Apparatus as in any one of claims 11, 12, or 21 wherein the fan module includes a plurality of fan units.

24. Apparatus as in claim 2 wherein the receiving means includes a housing side wall.

25. Apparatus as in claim 12 or claim 21 wherein the receiving means includes a housing side wall.

26. Apparatus as in claim 2 wherein the receiving means includes a receiving connector.

27. Apparatus as in claim 12 or claim 21 wherein the receiving means includes a receiving connector.

28. Apparatus as in claim 1 or claim 2 wherein the at least one fan unit is removable from the fan module.

29. Apparatus as in claim 11 or claim 12 wherein the at least one fan unit is removable from the fan module.

30. Apparatus as in claim 1 wherein the fan unit is interchangeable with a panel having modular integrated circuitry.

31. Apparatus as in any one of claims 11, 12 or 21 wherein the fan unit is interchangeable with a panel having module integrated circuitry.

32. Apparatus as in claim 1 or claim 2 wherein the fan unit is slidable on the fan module so that the fan unit can be selectively positioned to cool various portions of the circuitry.

33. Apparatus as in any one of claims 11, 12, or 21 wherein the fan unit is slidable on the fan module so that the fan unit can be selectively positioned to cool various portions of the circuitry.

34. Apparatus as in claim 1 or claim 2 wherein the fan module mounting means comprises an electrical board connector and the receiving means comprises an electrical receiving connector.

35. Apparatus as in claim 11 wherein the fan module mounting means comprises an electrical board connector and the receiving means comprises an electrical receiving connector.

36. Apparatus as claimed in claim 21 wherein the means for reducing the power surge includes:
  (a) a time delay means for delaying the time when the at least one fan unit is activated, so that the fan unit does not contribute to an initial power surge of the electronic system upon powering the electronic system; and
  (b) a noise filter for filtering power transients on the driving circuit.

37. Apparatus as claimed in claim 21 including a light-indicator device for indicating that electronic system power is on.

* * * * *